(12) United States Patent
Pun et al.

(10) Patent No.: US 11,718,111 B2
(45) Date of Patent: Aug. 8, 2023

(54) INKJET PRINTER WITH SUBSTRATE HEIGHT POSITION CONTROL

(71) Applicant: Kateeva, Inc., Newark, CA (US)

(72) Inventors: Digby Pun, San Jose, CA (US); Alexander Sou-Kang Ko, Santa Clara, CA (US); David C. Donovan, Newark, CA (US)

(73) Assignee: Kateeva, Inc., Newark, CA (US)

( * ) Notice: Subject to any disclaimer, the term of this patent is extended or adjusted under 35 U.S.C. 154(b) by 186 days.

(21) Appl. No.: 17/305,891

(22) Filed: Jul. 16, 2021

(65) Prior Publication Data

US 2021/0339543 A1 Nov. 4, 2021

Related U.S. Application Data

(63) Continuation of application No. 16/702,380, filed on Dec. 3, 2019, now Pat. No. 11,097,560.
(Continued)

(51) Int. Cl.
*B41J 11/58* (2006.01)
*F16M 11/18* (2006.01)
(Continued)

(52) U.S. Cl.
CPC .............. *B41J 11/58* (2013.01); *B41J 3/28* (2013.01); *B41J 25/3088* (2013.01); *F16M 11/18* (2013.01); *H05K 2203/013* (2013.01)

(58) Field of Classification Search
CPC ....... B41J 3/28; B41J 11/58; B41J 2/01; B41J 25/3088; B41J 25/308; B41J 25/3086;
(Continued)

(56) References Cited

U.S. PATENT DOCUMENTS 8,079,662 B2 * 12/2011 Nakajima ........... H01L 21/6715
414/781
9,961,782 B2   5/2018 Pun et al.
(Continued)

FOREIGN PATENT DOCUMENTS

CN         1964853 A    5/2007
CN       104661824 A    5/2015
(Continued)

OTHER PUBLICATIONS

International Search Report dated Feb. 25, 2020 to PCT Application PCT/US19/64638.

*Primary Examiner* — John Zimmermann
(74) *Attorney, Agent, or Firm* — Hauptman Ham, LLP

(57) ABSTRACT

An inkjet printer is described. The inkjet printer has a substrate holder assembly that includes a base member having a long axis in a first direction and a short axis in a second direction perpendicular to the first direction; a contact member coupled to the base member, the contact member having a long axis in the first direction and a short axis in the second direction; a holder carriage coupled to the base member; a linear extender coupled between the base member and the contact member and extending in a third direction intersecting with the first direction and the second direction from the base member toward the contact member; and a flex member coupled to the base member, extending in the second direction between the linear extender and the contact member, and having a flex direction in a direction perpendicular to the first direction and the second direction.

21 Claims, 10 Drawing Sheets

Related U.S. Application Data

(60) Provisional application No. 62/775,487, filed on Dec. 5, 2018.

(51) Int. Cl.
*B41J 3/28* (2006.01)
*B41J 25/308* (2006.01)

(58) Field of Classification Search
CPC .............. H01L 21/6715; H01L 21/683; H05K 2203/013; H05K 3/125; F16M 11/121; F16M 11/18
See application file for complete search history.

(56) References Cited

U.S. PATENT DOCUMENTS

| | | |
|---|---|---|
| 10,086,632 B1 | 10/2018 | Kondo |
| 2003/0169524 A1 | 9/2003 | Adin et al. |
| 2008/0069677 A1 | 3/2008 | Kawachi et al. |
| 2009/0047103 A1 | 2/2009 | Inamasu et al. |
| 2014/0293373 A1* | 10/2014 | Onishi .................... H04N 1/103 358/497 |
| 2014/0374375 A1 | 12/2014 | Zwiers et al. |
| 2015/0298153 A1 | 10/2015 | Baker et al. |
| 2017/0120574 A1* | 5/2017 | Nijkamp ................... G03F 9/00 |
| 2018/0014410 A1 | 1/2018 | Darrow et al. |
| 2018/0229497 A1 | 8/2018 | Darrow et al. |
| 2020/0023658 A1* | 1/2020 | Ko ........................... B41J 19/00 |
| 2020/0198374 A1 | 6/2020 | Pun |

FOREIGN PATENT DOCUMENTS

| | | |
|---|---|---|
| CN | 104842660 A | 8/2015 |
| CN | 105848904 A | 8/2016 |
| GB | 201313741 | 2/2015 |
| WO | 2013103298 A1 | 7/2013 |

* cited by examiner

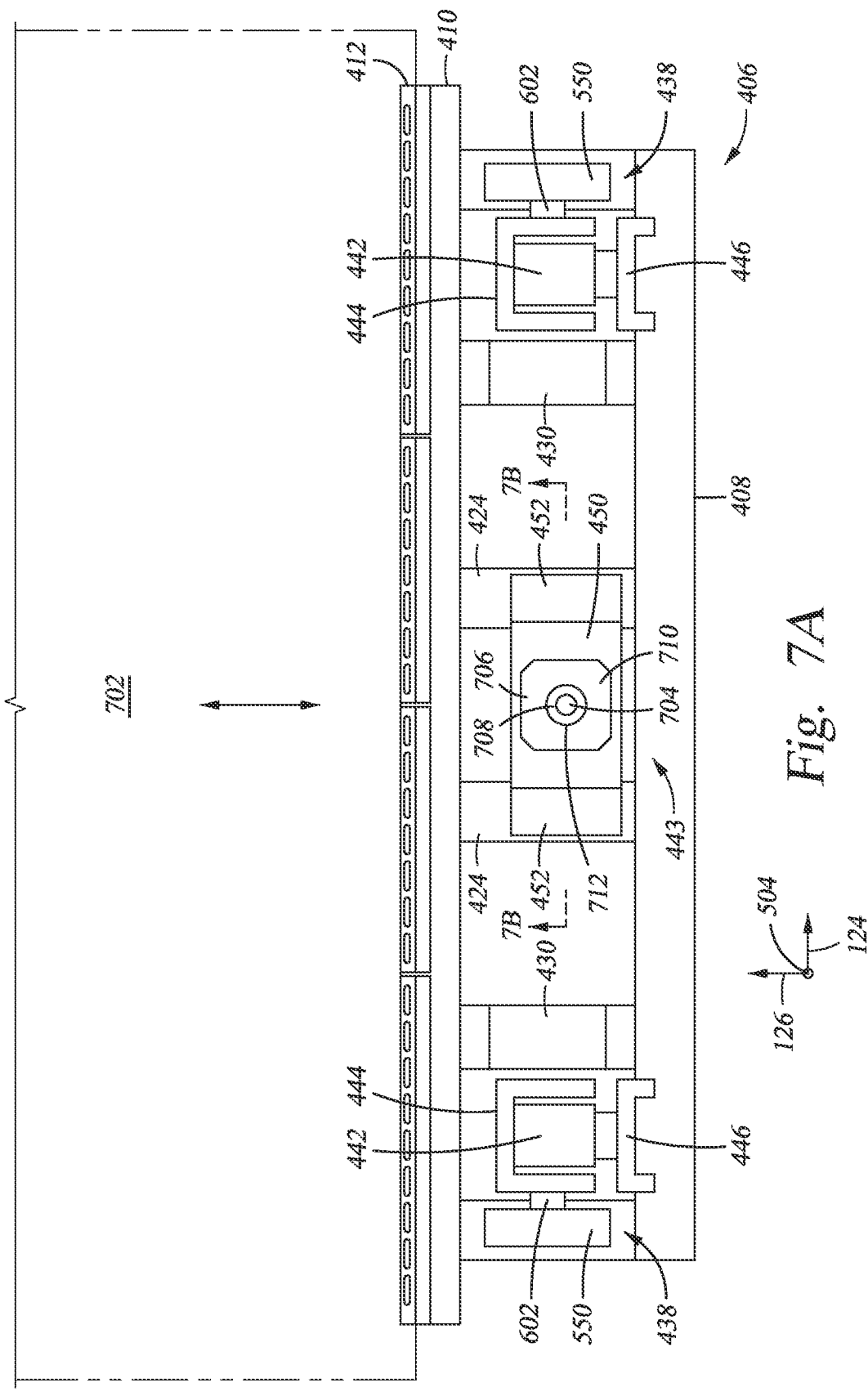

INKJET PRINTER WITH SUBSTRATE HEIGHT POSITION CONTROL

CROSS-REFERENCE TO RELATED APPLICATIONS

This application is a continuation of U.S. patent application Ser. No. 16/702,380, filed Dec. 3, 2019, which claims the benefit from U.S. Provisional Patent Application Ser. No. 62/775,487 filed Dec. 5, 2018, which are incorporated herein by reference.

FIELD

Embodiments of the present invention generally relate to inkjet printers. Specifically, methods and apparatus for monitoring and control of substrate position and orientation are described.

BACKGROUND

Inkjet printing is common, both in office and home printers and in industrial scale printers used for fabricating displays, printing large scale written materials, adding material to manufactured articles such as PCB's, and constructing biological articles such as tissues. Most commercial and industrial inkjet printers, and some consumer printers, use dispensers to apply print material to a substrate. The dispenser ejects a controlled quantity of print material toward a substrate at a controlled time and rate so that the print material arrives at the substrate in a target location and makes a mark having a desired size and shape.

In some cases, the precision of locating print material on the substrate is extreme. Micro-scale deviations in timing, quantity, or rate of print material ejection can cause printing faults. Similarly, imprecision in positioning the substrate to receive print material can cause the print material to arrive at the substrate off target. For example, if substrate distance from print ejectors is off target, the print material traverses a distance that is not expected, so the print material arrives at the substrate early or late. There is a need for substrate height control in high precision inkjet printing applications.

SUMMARY

Embodiments described herein provide a substrate holder assembly, comprising a base member having a long axis in a first direction and a short axis in a second direction perpendicular to the first direction; a contact member coupled to the base member, the contact member having a long axis in the first direction and a short axis in the second direction; a holder carriage coupled to the base member; a linear extender coupled between the base member and the contact member and extending in a third direction intersecting with the first direction and the second direction from the base member toward the contact member; and a flex member coupled to the base member, extending in the second direction between the linear extender and the contact member, and having a flex direction in a direction perpendicular to the first direction and the second direction.

Other embodiments described herein provide an inkjet printer, comprising a substrate support; a dispensing assembly attached to the substrate support; and a holder assembly attached to the substrate support, the holder assembly comprising a holder carriage operatively coupled to a slide attached to the substrate support; a base member coupled to the holder carriage and having a long axis in a first direction along a side of the substrate support; a contact member coupled to the base member and having a long axis in the first direction, the contact member having a manipulator at an edge of the contact member adjacent to the substrate support; a first linear extender coupled to the base member and extending from the base member toward the contact member at a location adjacent to the edge of the contact member having the manipulator; a first flex assembly coupled to the base member and extending toward the manipulator; a second linear extender coupled to the base member and extending from the base member toward the contact member at a location adjacent to the edge of the contact member having the manipulator; and a second flex assembly coupled to the base member and extending toward the manipulator.

Other embodiments described herein provide a substrate holder assembly, comprising a holder carriage; a base member coupled to the holder carriage and having a long axis in a first direction; a contact member coupled to the base member such that the base member is between the holder carriage and the contact member, the contact member having a long axis in the first direction, the contact member having a manipulator extending along a long edge of the contact member; a first linear extender coupled to the base member and extending through the base member to the contact member at a location adjacent to the edge of the contact member having the manipulator; a first flex assembly coupled to the base member and extending toward the manipulator; a second linear extender coupled to the base member and extending through the base member to the contact member at a location adjacent to the edge of the contact member having the manipulator; and a second flex assembly coupled to the base member and extending toward the manipulator.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 7A is a plan view of the holder assembly of FIG. 4.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
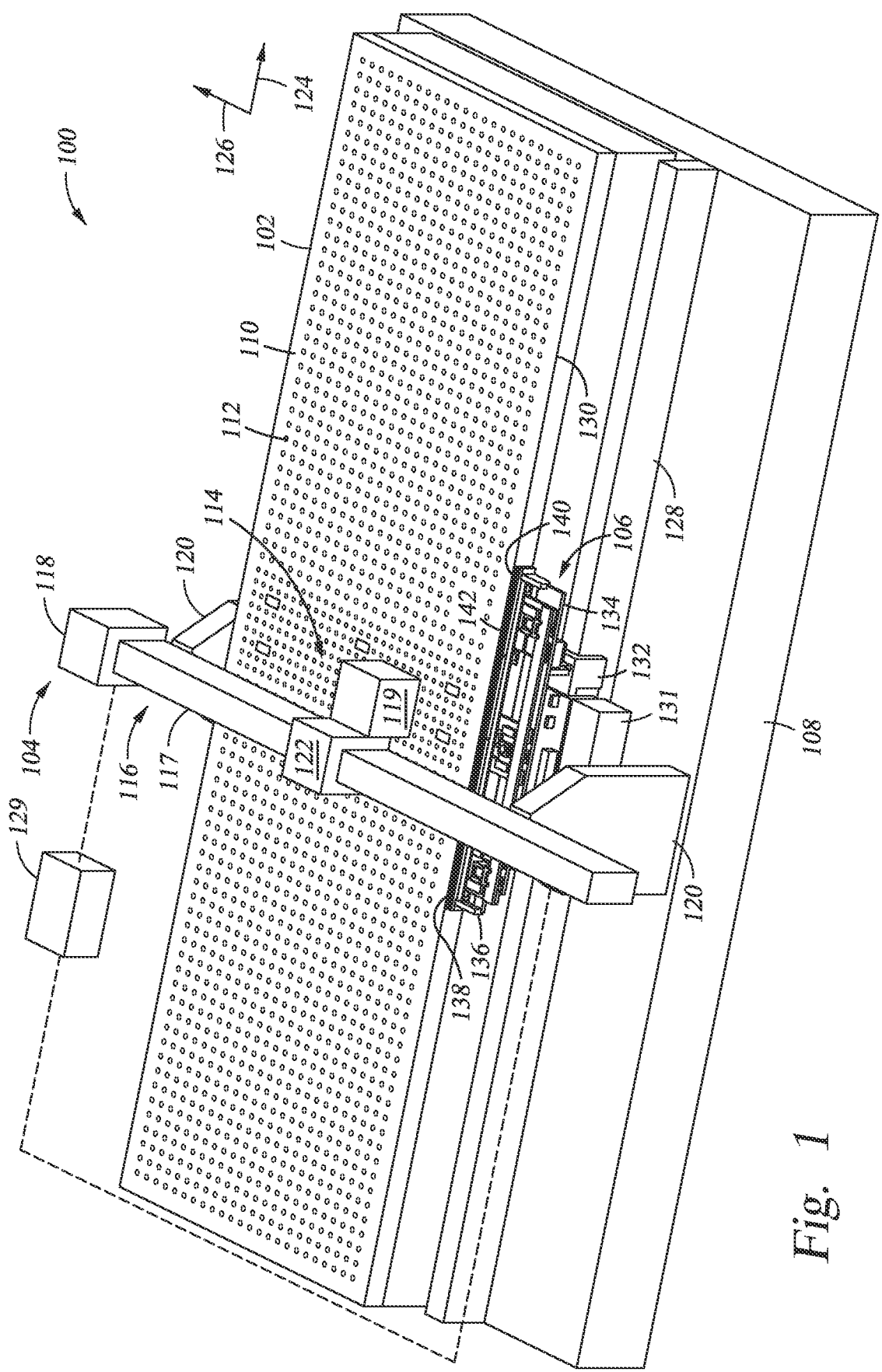
FIG. 1 is a top isometric view of an inkjet printer according to one embodiment.

An inkjet printer is described herein with height control features to ensure precision in placement of print material on a substrate. FIG. 1 is a top isometric view of an inkjet printer 100 according to one embodiment. The inkjet printer has a substrate support 102, a print assembly 104, and a holder assembly 106 for manipulating a substrate for printing. The printer 100 is founded upon a base 108, which is typically a massive object to minimize vibratory transmissions to the operative parts of the printer 100. In one example, the base 108 is a granite block. The substrate support 102 is located upon the base 108, and comprises a support surface 110 along with means for making the support surface 110 substantially frictionless. Here, the support surface 110 is an air table that provides a gas cushion on which the substrate floats. The support surface 110 features a plurality of holes 112 that allow jets of gas to exit, thus providing an upward force to maintain a substrate at a desired elevation above the support surface 110. Some of the holes may also allow controlled withdrawal of gas from the gas cushion floating the substrate support to provide precise local control of substrate elevation.

The print assembly 104 comprises a dispenser assembly 114 disposed on a print support 116. The print support 116 is disposed in relation to the substrate support 102 to provide access for the dispenser assembly 114 to position constructively in relation to a substrate on the substrate support 102 so that print material can be precisely applied to the substrate. Here, the print support 116 includes a rail or beam 117 that traverses the substrate support 102, allowing the dispenser assembly 114 to traverse the substrate support 102 and deposit print material at any location on the substrate from one side of the print support 116 to the opposite side thereof. In this embodiment, the print support 116 is attached to the base 108 and extends from the base 108 to provide stable support for the dispenser assembly 114. Two stands 120 extend from the base 108, on opposite sides of the substrate support 102, to the rail 117, which extends across the substrate support 102. The stands 120 and the rail 117 can both be made of the same material as the base 108. In this case, the stands 120, the rail 117, and the base 108 are integrally formed from one piece of granite.

The dispenser assembly 114 typically includes one or more dispensers 119 along with a print assembly controller 118 that includes electronics and sensors for controlling the functional parameters of the dispensers 119 such as location of the dispensers 119 along the print support 116, timing, duration, type of print material, and dispensing profile. The dispensers 119 typically ride along the print support 116 by operation of a print carriage 122 that couples with the print support 116 to translate the dispensers 119 along the rail 117 from one end of the rail to the other opposite end. Power and signal conduits are not shown to simplify the figures.

A substrate is positioned under the print assembly 104 by the holder assembly 106. The holder assembly 106 acquires secure contact with the substrate upon loading and moves the substrate along the substrate support 102 to position the substrate with respect to the print assembly 104 for dispensing print material onto the substrate in a precise fashion. The holder assembly 106, in this case, is located on one side of the substrate support 102 and generally extends along the substrate support 102 in a first direction to translate the substrate in the first direction during printing. The first direction is denoted in FIG. 1 by arrow 124. The dispensers 119 generally move in a second direction substantially perpendicular to the first direction, as determined by the rail 117, which extends substantially in the second direction, denoted in FIG. 1 by arrow 126. The second direction 126 is sometimes referred to as the "x direction," and the rail 117 as the "x beam."

The holder assembly 106 is generally disposed on a holder assembly support 128, which in this case is a rail that extends in the first direction substantially the entire length of the substrate support 102 along an edge 130 of the substrate support 102. In this embodiment, the holder assembly support 128 is attached to the base 108 to provide stable support for the holder assembly 106. The holder assembly support 128 may be made from the same material as the base 108. In this case, the holder assembly support 128, base 108, and print support 116 are integrally formed from one piece of granite. Sometimes, the holder assembly support 128 is referred to as a "y beam".

The holder assembly 106 comprises a holder carriage 132 that rides along the holder assembly support 128. A base member 134 is coupled to the holder carriage 132 and a contact member 136 is coupled to the base member 134 with the base member 134 between the holder carriage 132 and the contact member 136. The contact member 136 includes a manipulator 138 located at an edge 140 of the contact member 136 nearest the edge 130 of the substrate support 102. Here, a vacuum source (not shown) is coupled to the holder assembly 106 to provide vacuum at a contact surface 142 of the manipulator 138 to securely hold a substrate for processing on the substrate support 102. The holder assembly 106 moves along the holder assembly support 128 during operation to position the securely held substrate at any location on the substrate support 102 such that the print assembly 104, for example by operation of the print assembly controller 118, can position the dispensers 119 to provide access to a precise location on the substrate for dispensing print material.

A system controller 129 receives signals from various sensors that may be deployed throughout the printer 100 and sends signals to the systems of the printer 100 to control printing. Here, the system controller 129 is shown operationally coupled to the print assembly controller 118 and to a holder assembly controller 131, which controls operation of the holder assembly 106. Each of the substrate support 102, the print assembly 104, the holder assembly 106, and potentially other ancillary systems such as environment control and materials management systems, may have sensors operatively coupled to the system controller 129 to transmit signals to the system controller 129 related to the status of various components during a print operation. The system controller 129 includes data and instructions to determine control signals to send to various controlled components of the printer 100.

When printing on a substrate, it is often desired to place microscopic droplets of print material, for example print material droplets having diameter of 5-10 µm in an area of the substrate of dimension 10-15 µm. In this operation, the print material is typically dispensed while the substrate is moving to minimize print time. This extreme precision is complicated by tiny imperfections in the dimensions of the various parts of the print system, variation of those dimensions with temperature, imprecision in speed of translation of the substrate, the dispenser assembly, and the holder assembly 106, and imprecision in the distance of the substrate from the dispensers 119. If distance of the dispensers 119 to the substrate is not precisely known or controlled, droplet velocity of print material from the dispensers 119 cannot be programmed for the print material droplet to arrive at the target location when the substrate is in the proper position. The droplet arrives too early or too late and misses the target.

Figure 2:
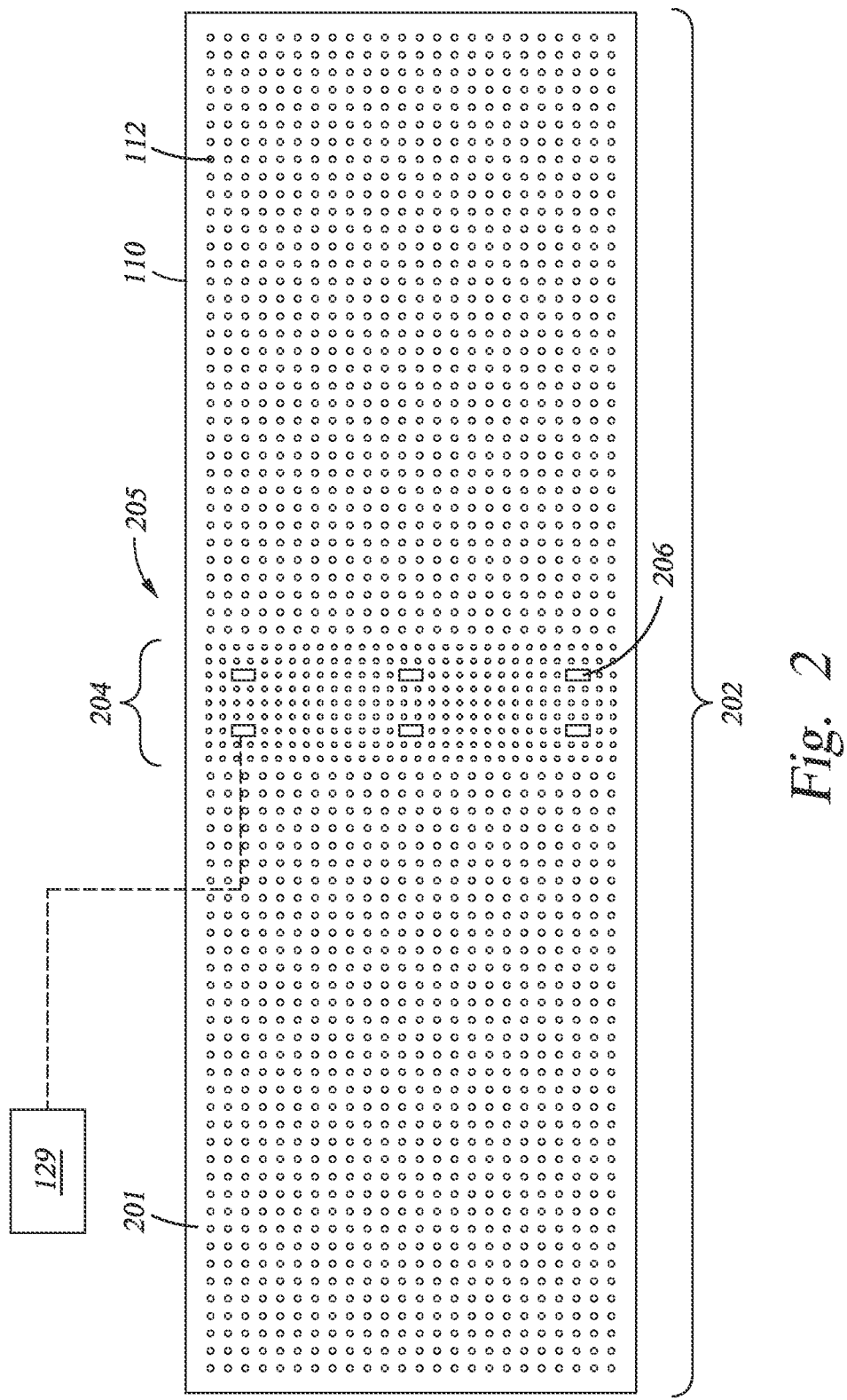
FIG. 2 is a plan view of a substrate support according to one embodiment.

Apparatus and methods for controlling distance of the substrate from the dispensers 119, sometimes referred to as "fly height" when the substrate is floated on a gas cushion, are described herein. One or more sensors is included in the substrate support 102 or the print assembly 104 to sense one or more distances of the substrate, for example from the substrate support 102 or some part of the print assembly 104. FIG. 2 is a plan view of a substrate support 200 according to one embodiment. The substrate support 200 may be used as the substrate support 102 in the printer 100 of FIG. 1. The substrate support 200 includes a first plurality of holes 202 formed in a support surface 201 of the substrate support 200 for providing gas between the support surface 201 and a substrate disposed thereon to establish a gas cushion for supporting the substrate at a target height above the support surface 201. The substrate support 200 also includes a second plurality of holes 204 formed in the support surface 201 for providing suction between the support surface 201 and the substrate disposed thereon. A gas source (not shown) comprising an inert gas is fluidly coupled to the first plurality of holes 202 and a vacuum source (not shown) is fluidly coupled to the second plurality of holes 204. The gas source and vacuum source are operated to provide a gas cushion of a target thickness and/or pressure between the substrate and the support surface 201. Here, the first plurality of holes 202 is uniformly spread across the support surface 201 substantially from end to end of, and entirely across, the support surface 201. The second plurality of holes 204 is interspersed with the first plurality of holes 202 in a central area 205 of the support surface 201. The vacuum provided through the second plurality of holes 204 works in conjunction with the gas cushion provided through the first plurality of holes 202 in the central area 205 to provide control over the height of the substrate above the support surface 201 in the central area 205 where deposition of print material on the substrate takes place.

A plurality of distance sensors 206 is disposed in the support surface 201 to sense a distance between the substrate and the support surface 201. Because the substrate can be large, a plurality of sensors 206 can be used to sense the distance at multiple parts of the substrate. In other cases, a single sensor 206 can be used. Here, the sensors 206 are shown regularly spaced in the support surface 201. The sensors 206 can be capacitive, inductive, optical, or acoustic, or a mixture thereof. In one embodiment, only capacitive sensors are used. In another embodiment, capacitive and optical sensors are used. The optical sensors may be interference based, diffractive, spectral, and/or triangulation-based. The distance sensors 206 can be operatively coupled to the system controller 129 (FIG. 1) to send signals representing the sensed distance to the system controller 129. Each sensor 206 sends a signal related to the distance of the substrate from the sensor 206, along with an identity code. The system controller 129 receives the signal and the identity code and stores the signal and the identity code. The system controller 129 also converts the signal into a distance, and may convert the identity code into a location of the support surface 201 based on a predetermined mapping of the sensors 206.

The type and density of the sensors 206 may vary across the support surface 201. For example, some areas of the support surface 201 may have no sensors 206 if distance from the support surface 201 is not sensed in that area. Some areas may have a low density of sensors 206 if low granularity of distance measurement is sufficient in that area. Other areas may have a high density of sensors 206 if high granularity of measurement is desired in that area. In this case, the support surface 201 has a high granularity of sensors 206 in the zone proximate to the print assembly 104 where print material is dispensed to provide more precise control of substrate distance from the dispensers 119 (FIG. 1).

Figure 3:
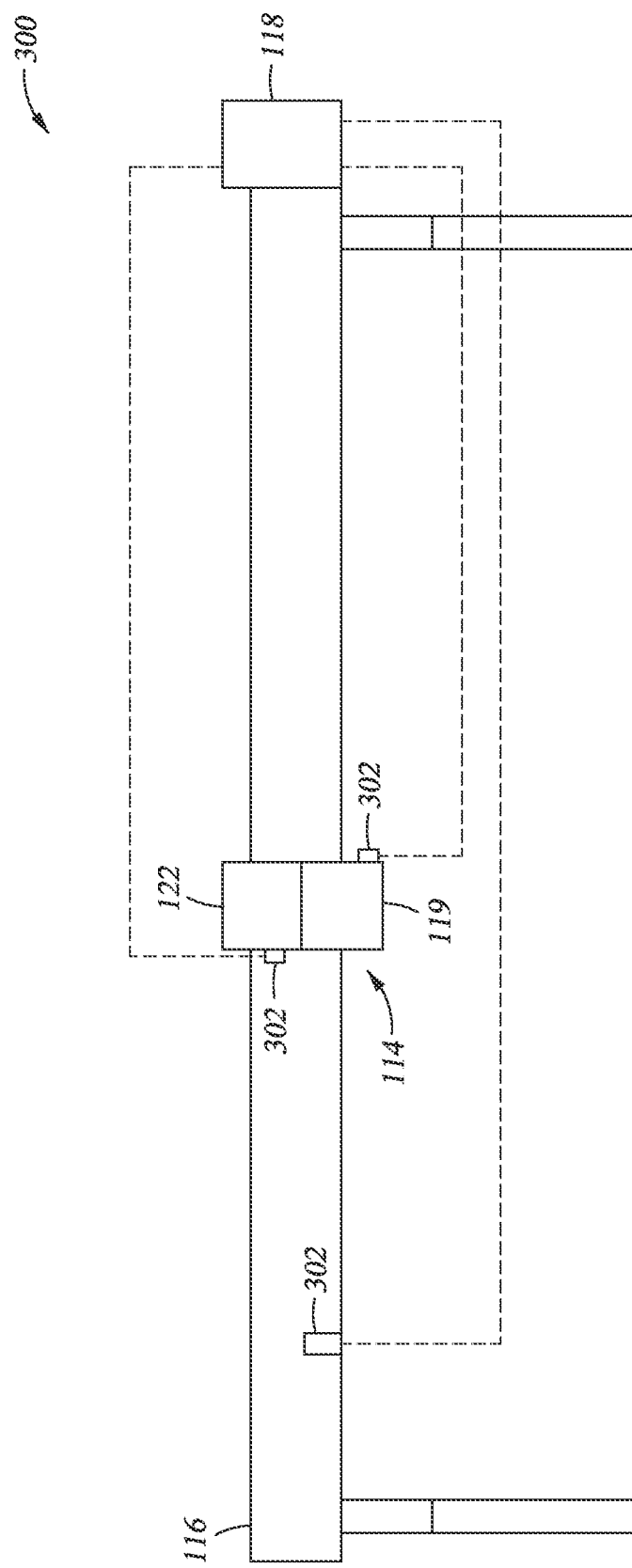
FIG. 3 is a side view of a print assembly according to one embodiment.

In another embodiment, one or more sensors may be attached to the print assembly. FIG. 3 is a side view of a print assembly 300 according to one embodiment. The print assembly 300 may be used as the print assembly 104 in the printer 100 of FIG. 1. The print assembly 300 includes similar elements to the print assembly 104 of FIG. 1, which will be labeled using the same reference numerals. The print assembly includes one or more sensors 302 for sensing a distance of the substrate. One sensor 302 is shown here mounted on the print support 116. Another sensor 302 is shown here mounted on the print carriage 122. Another sensor 302 is shown mounted on one of the dispensers 119. Any or all of these sensors 302 can be used to sense a relevant distance of the substrate. If multiple sensors 302 are used, perhaps along with sensors 206 in the support surface 201 of the substrate support 200, multiple distance readings can be compared by the system controller 129 and an estimate of distance having improved accuracy may result. The sensors 302 may be optical or acoustic. Any of the optical sensors described above can be used for the sensors 302. The sensors 302 are shown here operatively coupled to the print assembly controller 118 to send signals representing distance readings to the print assembly controller 118. It should be noted that the sensors 302 and other operative elements of the print assembly 104 may be directly operatively connected to the system control 129 without using a print assembly controller.

Figure 4:
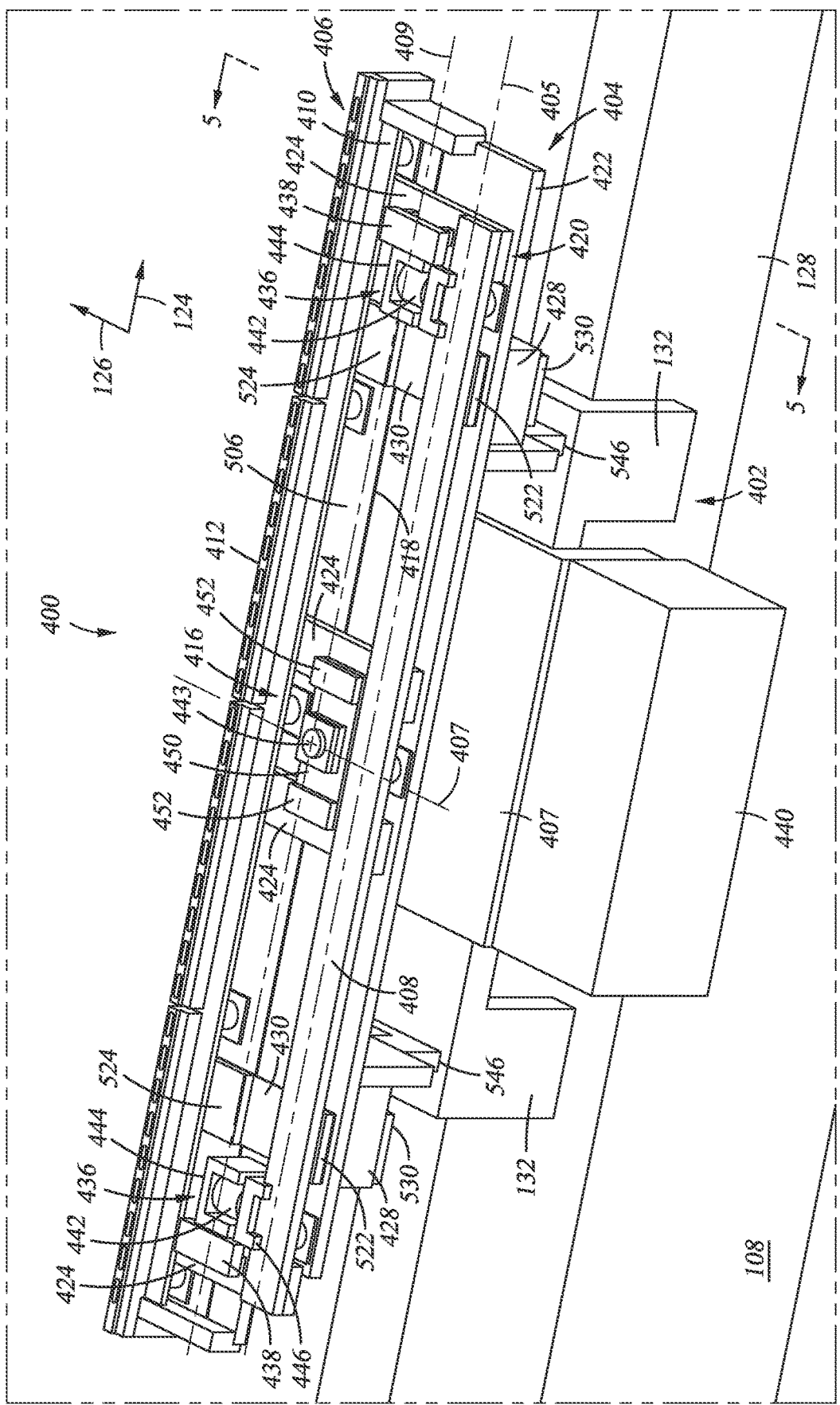
FIG. 4 is a top isometric view of a holder assembly for the inkjet printer of FIG. 1, according to one embodiment.

Substrate height can be controlled by adjusting the gas cushion supporting the substrate. If substrate height is adjusted up or down, a slight curvature may develop near the edge of the substrate contacting the holder assembly if the holder assembly is not also adjusted. FIG. 4 is an isometric view of a holder assembly 400 according to one embodiment. The holder assembly 400 has the capability to adjust the edge of the substrate in a direction perpendicular to the support surface 201 of the substrate support 200 (or 102). The holder assembly 400 can be used as the holder assembly 106 described above.

The holder assembly 400 has a carriage member 402, a base member 404 coupled to the carriage member 402, and a contact member 406 coupled to the base member 404 such that the base member 404 is between the contact member 406 and the carriage member 402. The contact member 406 contacts the substrate along an edge thereof using vacuum to make stable secure contact with the substrate. A vacuum source (not shown) is fluidly coupled to the holder assembly 400 to provide vacuum force. The carriage member 402 supports substantially frictionless motion of the holder assembly 400 along the holder assembly support 128.

The base member 404 has a long axis 405 that extends in the first direction 124 and is substantially the same as the dimension of the support surface 201 (FIG. 2) of the substrate support 102 in the first direction 124. The base member 404 has a short axis 407 in the second direction 126.

The base member 404 may be plate-like, and may have various openings for fasteners, sensors, actuators, and the like. The base member 404 is fastened to the carriage member 402 to provide stable support for the contact member 406 as the carriage member 402 translates along the holder assembly support 128. In this embodiment, the base member 404 extends beyond the ends of the carriage member 402 in the first direction 124 and the carriage member 402 is centrally located with respect to the base member 404. Here, the base member 404 is rectangular in profile.

The contact member 406 is adjustably coupled to the base member 404. The contact member 406 includes a fulcrum 408, a manipulator stage 410, a manipulator 412 coupled to the manipulator stage, and a plurality of landing members (discussed further below) for attaching sensors and/or positioners to be described below. The contact member 406 has a long axis 409 in the first direction 124 and a short axis 411 in the second direction 126, and is substantially similar in length to the base member 404. The contact member 406 also has a rectangular profile, like the base member, since the fulcrum 408, the manipulator stage 410, and the manipulator 412 all extend substantially the length of the base member 404. The manipulator stage 412 is located at a support edge 416 of the contact member 406 adjacent to the substrate support 102 and is adjacent to a proximate edge 418 of the base member 404. The fulcrum 408 is located at an adjustment edge 420 of the contact member 406 opposite from the support edge 416, and is adjacent to a corresponding opposite edge 422 of the base member 404.

Figure 5:
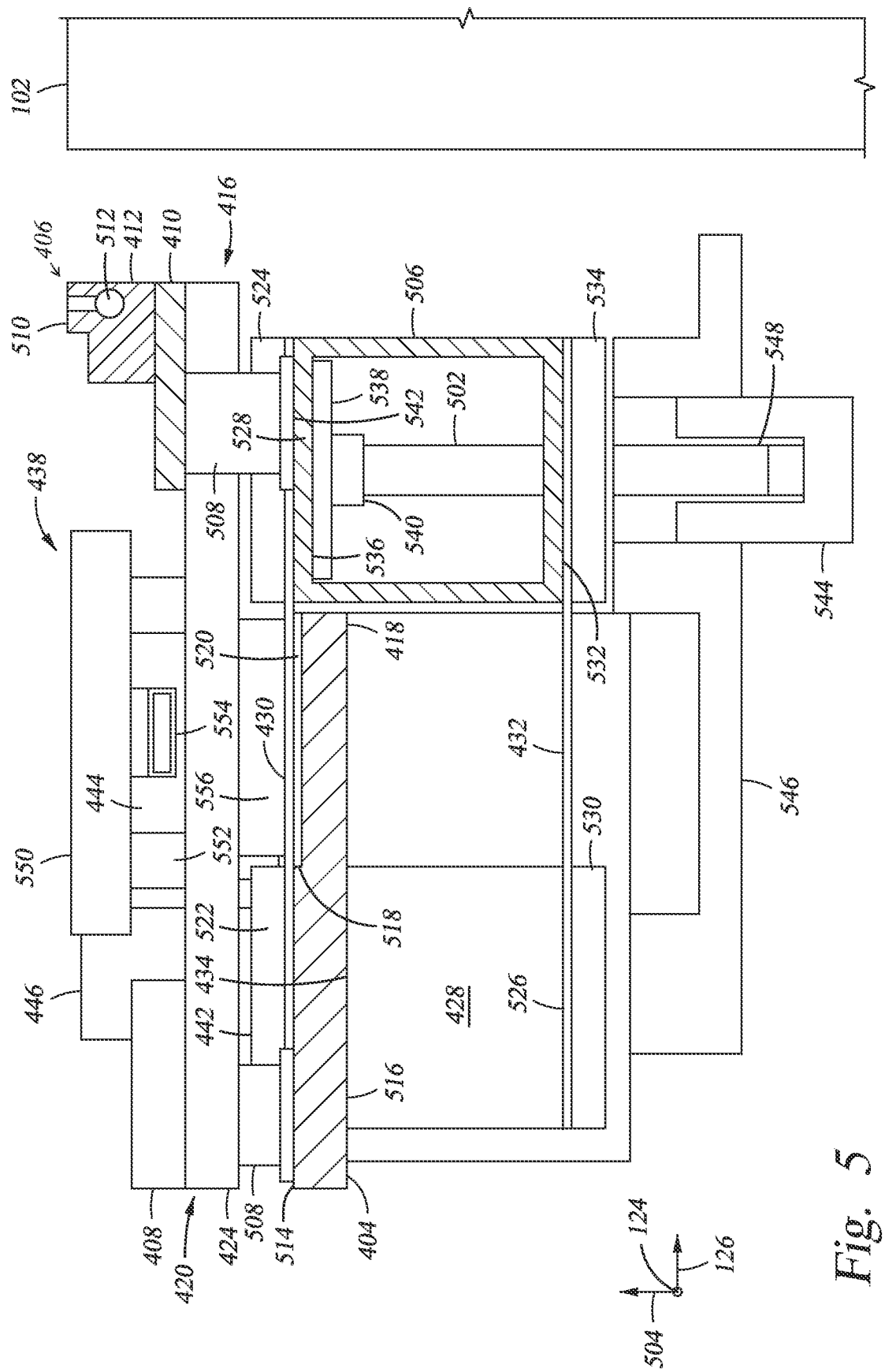
FIG. 5 is a cross-sectional view of a portion of the holder assembly of FIG. 4.

FIG. 5 is a cross-sectional view of the holder assembly 400 of FIG. 4. A linear extender 502 is coupled to the base member 404 and extends from the base member 404 toward the contact member 406. The linear extender 502 is located at the support edge 416 of the contact member 406 and extends toward the contact member 406 in a third direction 504 perpendicular to the first and second directions. The linear extender 502 may also extend somewhat in either or both of the first and second directions 124 and 126. The linear extender 502 may be any precision positioner capable of positioning an object to an accuracy of less than 10 µm, such as a piezoelectric positioner. In the piezoelectric embodiment, a sample of a piezoelectric material is oriented to change length in the third direction when voltage is applied, and the degree of length change is directly and precisely related to the applied voltage.

A bearing member 506 is disposed between the linear extender 502 and the contact member 406. The bearing member 506 is located adjacent to the base member 404 at the support edge 416 of the contact member 406. The linear extender 502 applies a positioning force to the bearing member 506, which in turn transmits the positioning force to the contact member 406. The bearing member 506 extends in the first direction 124 and has a length substantially the same as the length, in the first direction 124, of the contact member 406. Thus, the bearing member 506 runs along the contact member 406 substantially along the entire length of the contact member 406 in the first direction 124. Here, the bearing member 506 is hollow to reduce weight, and the bearing member 506 has a dimension in the second direction 126 larger than the dimension, in the second direction 126, of the manipulator stage 410 of the contact member 406.

A landing member 508 is disposed between the bearing member 506 and the manipulator stage 410. The landing member 508 mediates the positioning force of the linear extender 502 on the contact member 406. The landing member 508 may be made of a sturdy, resilient material to absorb any impulses or shocks that might be transmitted between the contact member 406 and the bearing member 506. In other cases, the landing member 508 may be an air bearing. A plurality of landing members 508 are provided distributed along the length of the bearing member 506 and the manipulator stage 410 to provide stable consistent positioning support along the length of the manipulator stage 410.

The linear extender 502 changes length in the third direction 504 when actuated. When the linear extender 502 extends, the bearing member 506 is thrust toward the contact member 406 in the third direction 504 to shift the position of the support edge 416 of the contact member 406 in the third direction 504. When a substrate is disposed on the manipulator 412, the substrate contacts the manipulator 412 at a contact surface 510. Vacuum is applied to the contact surface 510 through a vacuum manifold 512, which is a conduit running through the manipulator 412 along a length thereof in the first direction 124. The pressure differential caused by the vacuum forces the substrate against the contact surface 510 such that the substrate moves with the manipulator 412, the manipulator stage 410, and the contact member 406. At the support edge 416, by operation of the linear extender 502, the manipulator 412 is moved in the third direction 504 such that a height of the substrate above the substrate support 102 near the holder assembly 400 is modified.

Referring again to FIG. 4, the contact member 406 includes a plurality of braces 424 that couple the manipulator stage 410 to the fulcrum 408. Here, there are four braces 424, two at the opposite ends of the fulcrum 408 and two near the center of the contact member 406 on either side thereof. The fulcrum 408, in this case, has a dimension in the first direction 124 that is less than a dimension of the manipulator stage 410 in the first direction 124. The braces 424 serve to couple the fulcrum 408 securely to the manipulator stage 410 such that the two move as a unit and the contact member 406 has structural integrity. The braces 424 are here oriented along the second direction 126, and are bar-like members that extend from the fulcrum 408 to the manipulator stage 410. Each brace 424 is disposed between the fulcrum 408 and the base member 404 and between the manipulator stage 410 and the bearing member 506, and each brace 424 is in direct contact with both the fulcrum 408 and the manipulator stage 410. Each brace 424 also forms a right angle with the fulcrum 408 and with the manipulator stage 410.

One brace 424 is visible in FIG. 5. A second landing member 508 is disposed between the base member 404 and the fulcrum 408, shown here behind the brace 424. The second landing member 508 supports the fulcrum 408 at the adjustment edge 420 of the contact member 406. As the linear extender 502 extends, thus moving the bearing member 506, the landing member 508, the manipulator stage 410, and the manipulator 412 in the third direction 504, the brace 424 couples the motion of the foregoing members at the support edge 416 to the fulcrum 408 at the adjustment edge 420. Because the positioning force of the linear extender 502 is not directed through a centroidal axis of the contact member 406, the contact member 406 rotates such that the fulcrum 408 does not move in the third direction 504. The contact member 406 thus forms an angle θ with respect to the base member 404. The angle θ is typically, at most a few microradians in extent, for example from zero to 100 microradians. The second landing member 408 may also be an air bearing.

The base member 404 includes a support block 428 that supports a first flex member 430 and a second flex member 432, forming a pair of flex members. The support block 428 has a first side 434 that contacts the base member 404. Here, the second landing member 408 contacts the base member 404 on a first side 514 thereof and the support block 428 contacts the base member 404 on a second side 516 thereof, opposite from the first side 514. The base member 404 is thus disposed between the second landing member 408 and the support block 428. The first side 514 of the base member 404 has a shelf 518 located between the second landing member 508 and the proximate edge 418 of the base member 408. At the shelf 518, the base member 404 changes thickness from a first thickness between the support block 428 and the second landing member 508 to a second thickness, the second thickness being less than the first thickness. Thus, as the base member 404 extends from a location adjacent to the fulcrum 408 to a location toward the manipulator stage 410, the base member 404 declines in thickness at the shelf 518.

The first flex member 430 is attached to the first side 514 of the base member 404 opposite from the location where the support block 428 is attached to the second side 516 of the base member 404, between the fulcrum 408 and the base member 408. The first flex member 430 extends in the second direction 126 toward the manipulator stage 410, beyond the shelf 518 and the proximate edge 418 of the base member. At the shelf 518, a gap 520 is formed between the first flex member 430 and the base member 404 that allows the first flex member 430 freedom to flex in the third direction 504. The first flex member 430 thus has a flex direction in the third direction 504. The first flex member 430 extends to a position between the bearing member 506 and the manipulator stage 410. The first flex member 430 is fixed to the base member 404 by a first capture plate 522, being disposed between the base member 404 and the first capture plate 522 and fastened by convenient fasteners, such as bolts. The first flex member 430 is fixed to the bearing member 506, at a first side 528 thereof, by a second capture plate 524, the first flex member 430 being disposed between the second capture plate 524 and the bearing member 506. In this way, as the bearing member 506 is moved in the third direction 504 by the linear extender 502, the first flex member 430 flexes in the third direction 504 to provide a restorative force opposing the positioning force of the linear extender 502. As can be seen in FIG. 5, the landing member 508 is in supporting relationship with the first side 528 of the bearing member 506 and with the manipulator stage 410.

The second flex member 432 extends from a second side 526 of the support block 428, opposite from the first side 434, and is fixed to the second side 526 of the support block 428 by a third capture plate 530, which is fastened to the support block 428 by convenient fasteners, such as bolts. Here, the first and second members 430 and 432 are the same length. The second flex member 432 extends in the second direction 126 toward the bearing member 506. Here, the bearing member 506 is a hollow tube with a square profile. The second flex member 432 is attached to a second side 532 of the bearing member 506 opposite from the first side 528. The second flex member 432 is fixed to the second side 532 of the bearing member 506 by a fourth capture plate 534, the second flex member 432 being disposed between the fourth capture plate 534 and the second side 532 of the bearing member 506. The fourth capture plate 534 is fastened to the second side 532 of the bearing member 506 by convenient fasteners, such as bolts.

The linear extender 502 is here disposed through the second side 532 of the bearing member 506 to contact the first side 528 of the bearing member 506 at an interior surface 536 of the first side 528. A pressure member 538 at a force end 540 of the linear extender 502 contacts the interior surface 536 of the first side 528. The pressure member 538 applies the positioning force to the interior surface 536 of the first side 528 of the bearing member 506. The bearing member 506 contacts the first flex member 432 at an exterior surface 542 of the first side 528, transmitting the positioning force through the first flex member 432 to the manipulator stage 410 of the contact member 406, and thus to the manipulator 412. The manipulator 412 moves in response to the positioning force applied by the linear extender 502 to a precise location determined by the actuation control, for example voltage in the case of a piezoelectric element, applied to the linear extender 502. When in contact with a substrate disposed on the substrate support 102, the linear extender 502 accomplishes precision positioning of the edge of the substrate in the third direction 504. Thus, the linear extender 502 precisely affects the elevation of the edge region of the substrate above the substrate support 102, preventing contact between the edge region and the substrate support surface 201 in the event the elevation of the substrate changes in other regions. In this case, the linear extender 502 has a movement range of about 100 µm, but the movement range of the linear extender 502 can be selected based on the specific architecture and scale of the system. The first and second flex members 430 and 432, and in this orientation gravity, provide restorative force opposing the positioning force of the linear extender 502 on the bearing member 506 such that when actuation of the linear extender 502 is discontinued or lessened, the restorative force of the flex members 430 and 432 moves the bearing member 506 in a direction opposite to the direction of the positioning force, reducing the elevation of the substrate at the edge of the substrate support 102.

The linear extender 502 is supported by an extension 546 of the base member 404 that extends from the second side 516 of the base member 404 in the second direction 126 toward the bearing member 506. A stirrup 544 extends from the extension 546 in alignment with the linear extender 502, which is positioned in the stirrup 544. Here, the linear extender 502 is a cylindrical body with an axis that extends in the third direction 504, and may also extend somewhat in the first and second directions 124 and 126. The linear extender 502 is disposed with a support end 548 thereof, opposite from the force end 540, in the stirrup 544. The linear extender 502 extends through the fourth capture plate 534, the second flex member 432, and the second side 532 of the bearing member 506 to the interior of the bearing member 506, culminating in the force end 540 and the pressure member 538 disposed against the interior surface 536 of the first side 528 of the bearing member 506. When actuated, the linear extender 502 thus produces a separating force between the stirrup 544 and the bearing member 506 to move the bearing member 506 in the third direction 504 with respect to the stirrup 544 and the base member 404 to which the stirrup 544 is attached. As mentioned above, when actuation of the linear extender 502 is discontinued or lessened, the flex members 430 and 432 reverse the motion in the third direction 504.

Referring again to FIG. 4, the holder assembly 400 has two linear extenders (not visible in FIG. 4) positioned to supply stable positioning forces to the contact member 406, one on either side of a center line of the contact member 406. The position of the linear extenders can be seen by reference to the two support blocks 428, the first flex members 430, and the capture plates 522, 524, and 530. The bearing member 506 is also visible. The two linear extenders allow the two ends or sides of the contact member 406 to be differentially actuated in the third direction 504, if necessary, providing a capability to rotatably position a substrate about an axis in the second direction 126, sometimes referred to as a 8-*x* positioning capability. Each linear extender has a flex member pair, as shown in FIG. 5 referencing the first flex member 430 and the second flex member 432. Each flex member pair, and each linear extender, is coupled to the apparatus as shown in FIG. 5.

The linear extenders 502 described above cooperate with the flex members 430 and 432 to position the manipulator 412 in the third direction 504, so the linear extenders 502 are sometimes referred to as z-positioners. The holder assembly 402 also has linear positioners 436. There are two linear positioners 436, a first linear positioner 436 and a second linear positioner 436, in the version of FIG. 4 located near the opposite ends of the holder assembly 402. Each linear positioner 436 is disposed beside a respective encoder 438 and positions the contact member 406 in the second direction 126 by applying a positioning force to the contact member 406 in the second direction 126. Each linear positioner 436 includes an extension member 442 disposed in a containment 444 and against a wall 446. One of the linear positioners 436 and the encoders 438 are visible in FIG. 5. The extension member 442 has a first end that abuts the wall 446 and a second end that is disposed in the containment 444. The encoder 438 includes a pair of posts 552 on which is supported a scale 550. The posts 552 are attached to a brace 424 of the contact member 406. A side wall 556 of the containment 444 is visible between the posts 552 and through a gap between the brace 424 and the first flex member 430. The containment 444 is attached to the base member 404. The wall 446 is attached to the fulcrum 408 of the contact member 406. A read head 554 is attached to the containment 444 and projects into alignment with the scale 550.

Figure 6:
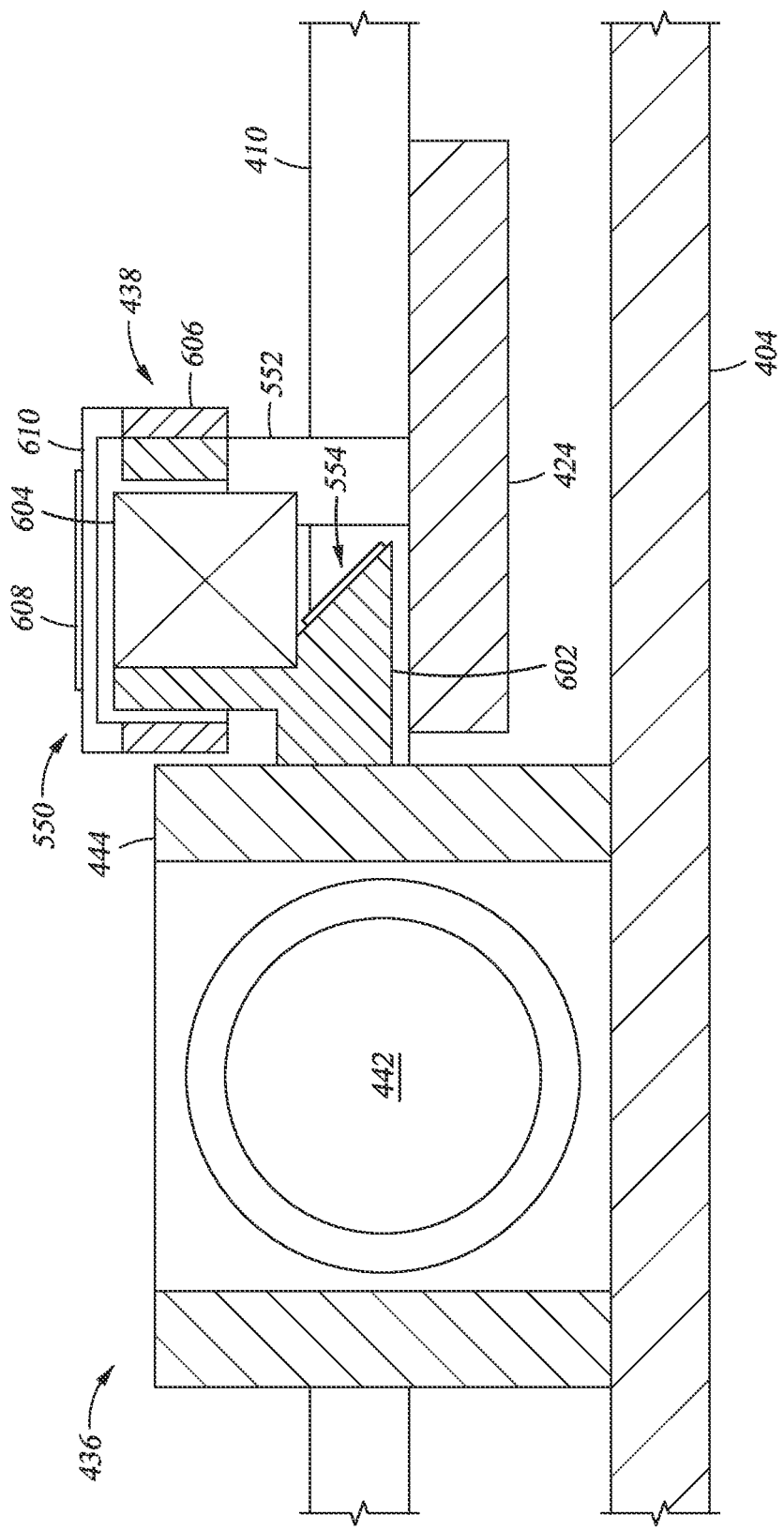
FIG. 6 is a detail view of a portion of the holder assembly of FIG. 4.

FIG. 6 is a detail view of one of the linear positioners 436 and encoders 438 of the holder assembly 400 of FIG. 4. This view looks from the position of the fulcrum 408 toward the manipulator stage 410. The extension member 442 is visible disposed inside the containment 444 and extending out of the plane of the figure. The read head 554 includes a support 602 attached to the containment 444 and a reader 604 attached to the support 602. The reader 604 is aligned with a metric 608 that lies atop the scale 550 of the encoder 438. The posts 552 support the scale 550 from one side such that the scale 550 extends from the posts 552 toward the containment 444. The reader 604 can thus be positioned between the scale 550 and the brace 424 in alignment with the metric 608. The metric 608 is applied at an external surface 610 of the scale 550 facing the reader 604.

The encoder 438 produces a signal representing a position of the reader 604 with respect to the metric 608. The metric 608 is attached to the contact member 406 by operation of the posts 552 attached to the brace 424. The reader 604 is attached to the base member 404 by operation of the support 602 and the containment 444. If the contact member 406 moves in the third direction 126 relative to the base member 404, the reader 602 registers a shift in position of the metric 608. To compensate for such a shift, the extension member 442 can be energized to apply a positioning force in the second direction 126 to the wall 446 (FIG. 5), and thus to the fulcrum 408 of the contact member 406. The extension member 442 is a two-way positioner, meaning that energy can be applied that extends or retracts the extension member 442. The extension member 442 may be pneumatic, electromagnetic, electromechanical, or any two-way actuatable extension member.

Referring again to FIG. 5, when the linear extender 502 (one of two in the embodiment of FIG. 4) extends in the third direction 504, rotation of the contact member 406 changes the angle θ of the contact member 406 with respect to the base member 404. In addition to movement of the manipulator 412 in the third direction 504, this results in movement of the manipulator 412 in the second direction 126. The encoder 438 registers this movement in the second direction 126 and sends a signal indicating position of the contact member 406 with respect to the base member 404 to the holder assembly controller 131 (FIG. 1), or to the system controller 129 in the absence of a separate holder assembly controller 131. In response, if the registered movement is not within tolerance, the holder assembly controller 131 or the system controller 129 may send a signal energizing the linear positioner 438 to adjust the position of the contact member 406 in the second direction 126. As shown in FIG. 4 and discussed above, there are two linear positioners 438 in the holder assembly 400. The two linear positioners 438 can be energized together to adjust the position of the entire contact member 406 in the second direction 126 to compensate for any mispositioning in the second direction 126 due to rotation of the contact member 406 or due to any other misalignments in the inkjet printer 100.

Referring again to FIG. 4, the contact member 406 is coupled to the base member 404 by a pivot 443 located near a center of both the contact member 406 and the base member 404. The pivot 443 is coupled to the base member 404 and extends through the contact member 406 between the two braces 424 near the center of the contact member 406. A flex plate 450 is disposed around the pivot 443 and extends to the braces 424 on either side of the pivot. The flex plate 450 is fixed to the two braces 424 by respective capture plates 452, which are fastened to the braces 424 by convenient fasteners, such as bolts.

FIG. 7A is a top view of the contact member 406 of FIG. 4. A substrate 702 is shown held on the manipulator 412. The components surrounding the two second linear positioners 438 are shown for reference. The pivot 443 includes a pivot post 704 extending through the contact member 406 near the center thereof. The pivot post 704 extends through the flex plate 450. The flex plate 450 allows the contact member 406 to move in the third direction 504 according to positioning forces applied by the linear extenders 502.

Figure 7B:
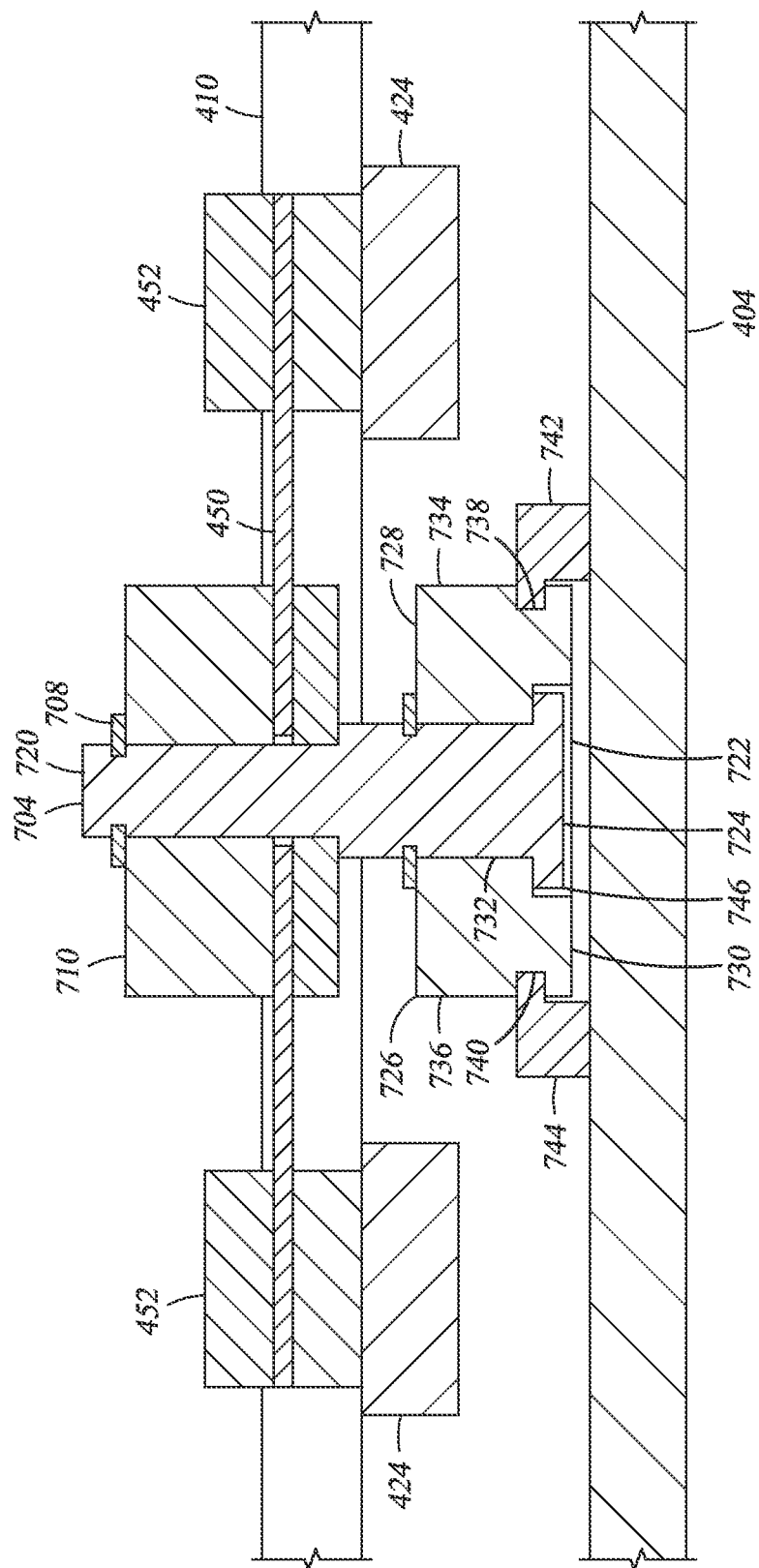
FIG. 7B is a cross-sectional view of a portion of the holder assembly of FIG. 4.

FIG. 7B is a cross-sectional view of a portion of the contact member 406 of FIG. 4. The pivot post 704 has a first end 720 and a second end 722. The first end 720 extends through the flex plate 450. The second end 722 has a flange 724 that couples to a slide member 726.

The slide member 726 has a first surface 728, a second surface 730, and a hole 732 through the slide member 726 from the first surface 728 to the second surface 730. The pivot post 704 extends through the hole 732 in the slide member 726. The slide member 726 has a third surface 734 connecting the first surface 728 with the second surface 730. The slide member 726 also has a fourth surface 736, opposite the third surface 734, and also connecting the first surface 728 with the second surface 730.

A first groove 738 is formed in the third surface 734. A second groove 740 is formed in the fourth surface 736. A first guide member 742 extends from the base member 404 and engages with the first groove 738. A second guide member 744 extends from the base member 404 and engages with the second groove 740. The slide member 726 slides along the guide members 742 and 744 to allow the slide member 726 to move in the second direction 126 (FIG. 7A).

The pivot post 704 is secured to the slide member 726, in this case, by a recess 746 formed in the second surface 730 of the slide member 726 around the hole 732. The flange 724 engages with the recess 746, and is captured in the recess 746 between the slide member 726 and the base member 404. The pivot post 704 extends through the flex plate 450, and is attached to the flex plate 450 by a center capture plate 710. The center capture plate 710 and the flex plate 450 both have openings that allow rotational movement of the center capture plate 710 and the flex plate 450 about the pivot post 704. In this way, the contact member 406 can rotate about the pivot post 704. Motion of the slide member 726 allows the contact member 406 to move in the second direction 126. In another embodiment, the pivot post 704 can be attached to the slide member 726. In the embodiment shown in FIG. 7B, the second end 730 of the pivot post 704 can rotate within the recess 746 with respect to the base member 404, for an extra degree of rotational freedom between the base member 404 and the contact member 406.

In this way, the linear extenders 502 can be actuated according to signals received from the system controller 129 or the holder assembly controller 131 to position the edge of the substrate 702 at a target elevation above the support surface 201 of the substrate support 200 or 102. The flex plate 450 flexes as the contact member 406 moves in the third direction 506, thus providing an additional restorative force opposing the action of the linear extenders 502. Additionally, the linear positioners 438 can be actuated according to signals received from the system controller 129 or the holder assembly controller 131 to compensate for displacement in the second direction 126 caused by movement of the manipulator 412 in the third direction 504 and attendant rotation of the contact member 406. The slide member 726 allows the contact member 406 to move in the second direction 126 to respond to positioning by the linear positioners 438. Finally, the linear positioners 438 can be differentially actuated to compensate for any misalignment of the substrate 702 or imperfection in positioning of the holder assembly 400 or 106 on the holder assembly support 128. The pivot post 704 allows the contact member 406 to rotate about the pivot post 704 according to the differential positioning applied by the linear positioners 438. The system described herein achieves precision positioning of the substrate 702 for printing operations.

Figure 8A:
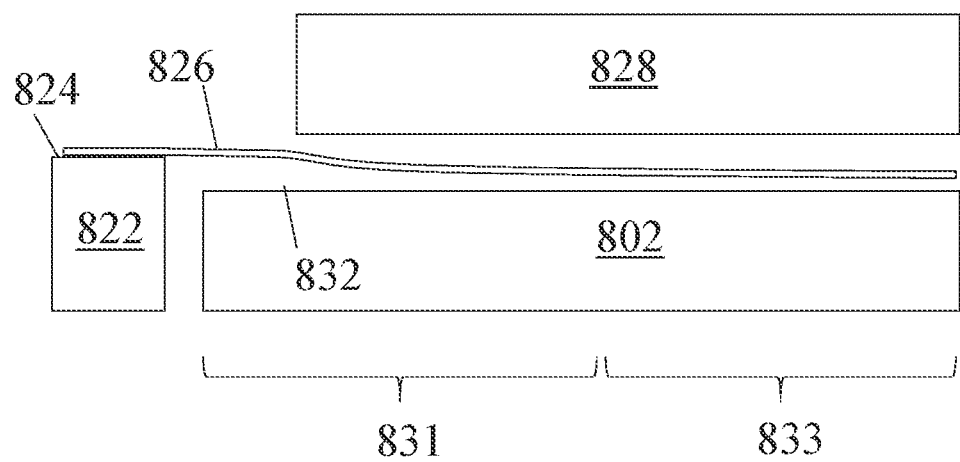
FIG. 8A is an activity diagram illustrating substrate edge positioning according to one embodiment.

As noted above, the holder assemblies described herein have the capability to adjust the position of the edge of the substrate in the third direction, and thus to adjust a distance between the substrate and the substrate support at the edge region of the substrate. This capability can be useful in the event the overall positioning of the substrate in the third direction changes. In such cases, the position of the edge region of the substrate can be changed to adapt. FIG. 8A is an activity diagram illustrating substrate edge positioning using embodiments described herein. A substrate 826 is positioned over a substrate support 802 for processing. Print material is to be ejected from a dispenser 828 onto the substrate 802, which is supported above the substrate support 802 by a gas cushion. A holder assembly 822, which may be any of the holder assemblies described herein, is positioned adjacent to the substrate support 802. The holder assembly has a contact surface 824, for example the contact surface 510 of FIG. 5. The substrate 826 is retained against the contact surface 824 by suction. The substrate support 802 forms a gas cushion that supports the substrate 826 between a dispenser 828 and the substrate support 802. The substrate support 802 has a top surface 832 which is flat. The substrate 826 is also flat and has a uniform separation distance between the dispenser 828 and a top surface of the substrate 826 in a first region 833. In a second region 831, the substrate 826 is deflected to access the contact surface 824. The top surface of the substrate 826 thus has a non-uniform separation distance from the dispenser 828. The holder assemblies described herein have the capability to move in the third direction to correct such non-uniform separation. Thus, if the separation distance of the substrate 826 from the dispenser 828 is non-uniform due to deflection of the substrate to the contact surface 824, the holder assembly 822 can be adjusted in the third direction to remove the deflection.

Figure 8B:
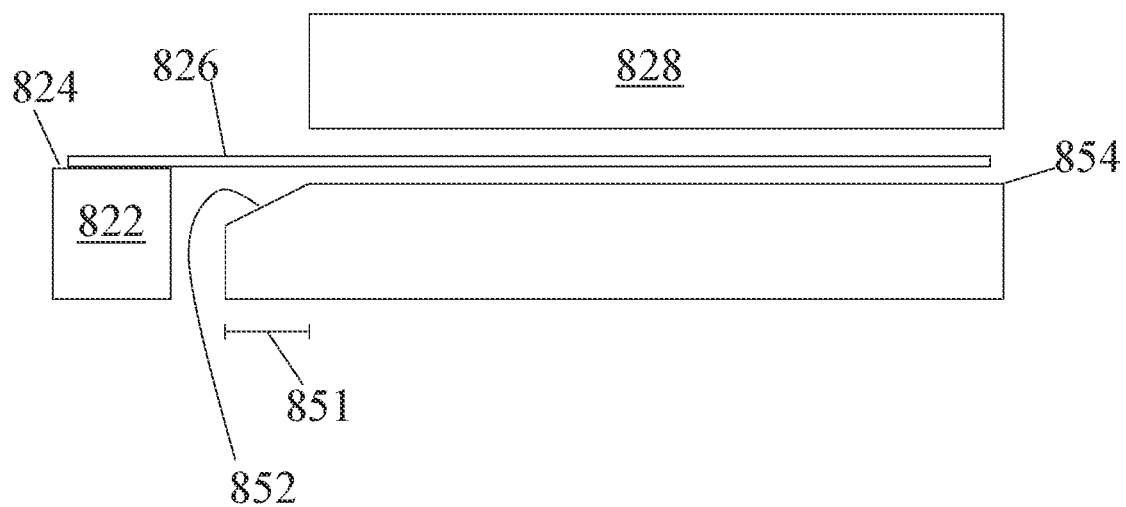
FIG. 8B is an activity diagram illustrating substrate edge positioning according to another embodiment.

FIG. 8B is another activity diagram illustrating substrate edge positioning according to another embodiment. In this case, a substrate support 850 is used that has a tapered edge 852. The tapered edge 852 of the substrate support 850 is adjacent to the holder assembly 822. The support surface 854 of the substrate support 850 recedes away from the substrate at the tapered edge 852 in a direction toward the holder assembly 822. In other words, a distance from the tapered edge 852 to the substrate 826 declines with distance from the holder assembly 822. The tapered edge 852 minimizes edge effects in substrate processing, facilitating adjustment of the edge region in the third direction to remove non-uniformity in spacing between the substrate 826 and the dispenser 828 without risking contact between the substrate 826 and the support surface 854.

The tapered edge 852 is generally linear. That is, the tapered edge 852 is a flat surface that forms an angle with the support surface 854 between about 1° and about 20°, for example about 5°. A width 851 of the tapered edge 852 in a direction parallel to the support surface 854 is from about 10 mm to about 30 mm, but can be larger. Here, the tapered edge 852 is shown forming a corner with the support surface 852. The corner may be sharp, as schematically portrayed here, or rounded or chamfered. For example, a slight chamfer of radius about 0.1 mm may be applied to the junction between the tapered edge 852 and the support surface 854.

While the foregoing is directed to embodiments of the present invention, other and further embodiments of the present disclosure may be devised without departing from the basic scope thereof, and the scope thereof is determined by the claims that follow.

What is claimed is:

1. A substrate holder assembly, comprising:
   a base member;
   a contact member coupled to the base member;
   a linear extender coupled between the base member and the contact member and oriented in a direction from the base member toward the contact member;
   a bearing member positioned to transmit a positioning force between the linear extender and the contact member; and
   a flex member pair coupled to the base member and the bearing member, the flex member pair comprising a first flex member and a second flex member, each of the first and second flex members having a flex direction aligned with the direction.

2. The substrate holder of claim 1, wherein the positioning force rotates the contact member.

3. The substrate holder of claim 1, wherein the first flex member extends between the bearing member and the contact member on a first side of the bearing member and the second flex member extends on a second side of the bearing member opposite from the first side.

4. The substrate holder of claim 1, wherein the base member includes a support block separating the first and second flex members.

5. The substrate holder of claim 1, wherein the base member is a base plate.

6. The substrate holder of claim 1, wherein the linear extender is a first linear extender and the direction is a first direction, and further comprising a second linear extender coupled between the base member and the contact member and oriented in a second direction from the base member toward the contact member.

7. The substrate holder of claim 2, wherein the flex member pair is a first flex member pair, and further comprising a second flex member pair coupled to the bearing member.

8. The substrate holder of claim 3, wherein the flex members of the second flex member pair extend to opposite sides of the bearing member.

9. The substrate holder of claim 4, wherein the base member includes a first support block separating the flex members of the first flex member pair and a second support block separating the flex member of the second flex member pair.

10. A substrate holder assembly, comprising:
a substrate contact member comprising a manipulator with a vacuum surface;
a first actuator to move the substrate contact member in a first direction and rotate the substrate contact member;
a second actuator to move the manipulator in a second direction substantially perpendicular to the first direction; and
a third actuator to move the manipulator in a third direction substantially perpendicular to the first and second directions.

11. The substrate holder assembly of claim 10, wherein the second and third actuators are members of the substrate contact member.

12. The substrate holder assembly of claim 10, wherein the third actuator comprises two linear actuators that can be operated to rotate the manipulator about an axis extending in the second direction.

13. The substrate holder assembly of claim 12, wherein the second actuator comprises two linear actuators that can be operated to rotate the manipulator about an axis extending in the third direction.

14. The substrate holder assembly of claim 13, further comprising a pivot located between the two linear actuators of the second actuator.

15. An inkjet printer, comprising:
a substrate support;
a dispensing assembly coupled to the substrate support; and
a substrate holder assembly coupled to the substrate support, the substrate holder assembly comprising:
a substrate contact member comprising a manipulator with a vacuum surface;
a first actuator to move the substrate contact member in a first direction and rotate the substrate contact member;
a second actuator to move the manipulator in a second direction substantially perpendicular to the first direction; and
a third actuator to move the manipulator in a third direction substantially perpendicular to the first and second directions.

16. The inkjet printer of claim 15, wherein the substrate holder assembly further comprises a flex member disposed to provide a restorative force to the substrate contact member.

17. The inkjet printer of claim 16, wherein the substrate contact member is attached to a fulcrum.

18. The substrate holder assembly of claim 10, wherein the substrate contact member is attached to a fulcrum.

19. The substrate holder assembly of claim 18, further comprising a flex member disposed to provide a restorative force to the substrate contact member.

20. The substrate holder assembly of claim 19, wherein the first actuator is a linear extender.

21. The substrate holder assembly of claim 20, wherein the linear extender is a first linear extender, and further comprising a second linear extender to move the substrate contact member in a first direction and rotate the substrate contact member, wherein a center of the substrate contact member is between the first linear extender and the second linear extender.

* * * * *